US010112269B2

United States Patent
Mantani et al.

(10) Patent No.: US 10,112,269 B2
(45) Date of Patent: Oct. 30, 2018

(54) SCREEN PRINTER, COMPONENT MOUNTING LINE, AND SCREEN PRINTING METHOD

(71) Applicant: PANASONIC CORPORATION, Osaka (JP)

(72) Inventors: Masayuki Mantani, Yamanashi (JP); Toshiyuki Murakami, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 336 days.

(21) Appl. No.: 14/490,843

(22) Filed: Sep. 19, 2014

(65) Prior Publication Data

US 2015/0090770 A1    Apr. 2, 2015

(30) Foreign Application Priority Data

Oct. 1, 2013  (JP) .................................. 2013-206076

(51) Int. Cl.
*H05K 13/00* (2006.01)
*B23K 37/04* (2006.01)
(Continued)

(52) U.S. Cl.
CPC ............ *B23K 37/0408* (2013.01); *B23K 3/08* (2013.01); *B41F 15/0881* (2013.01);
(Continued)

(58) Field of Classification Search
CPC .... B23K 37/0408; B23K 3/0638; B23K 3/08; B41F 15/0881; B41F 15/26; B41F 15/46; B41F 35/005; B41P 2215/114; B41P 2235/242; B41P 2235/244; B41P 2235/246; H05K 13/0465
See application file for complete search history.

(56) References Cited

U.S. PATENT DOCUMENTS 5,865,117 A * 2/1999 Asai ...................... B41F 35/005
101/123
2011/0315028 A1* 12/2011 Abe ........................ B41F 15/26
101/114
(Continued)

FOREIGN PATENT DOCUMENTS

CN      2202042 Y      6/1995
JP      S55-139286 A   10/1980
(Continued)

OTHER PUBLICATIONS

Office Action dated Feb. 16, 2016 for Japanese Patent Application No. 2013-206076.
(Continued)

*Primary Examiner* — Kiley S Stoner
*Assistant Examiner* — Carlos J Gamino
(74) *Attorney, Agent, or Firm* — Pearne & Gordon LLP

(57) ABSTRACT

A screen printer includes: a substrate holder that holds a substrate; a mask to be contacted with the substrate; an imaging device that images the substrate; an elevation mechanism that moves up the substrate holder at a below-mask-position below the mask based on a result of the imaging to contact the substrate with the mask; a horizontal moving mechanism that moves the substrate holder between the below-mask-position and a retreat position retreated in a horizontal direction from the below-mask-position; a printing head that moves on the mask contacted with the substrate and prints a paste on the substrate via the mask; and a mask cleaner that cleans a lower surface of the mask with the substrate separated from the mask by the elevation mechanism. The imaging of the substrate and the cleaning of the mask are performed with the substrate holder positioned at the retreat position.

5 Claims, 10 Drawing Sheets

(51) Int. Cl.
  *B23K 3/08* (2006.01)
  *B41F 35/00* (2006.01)
  *B41F 15/08* (2006.01)
  *B41F 15/26* (2006.01)
  *B41F 15/46* (2006.01)
  *H05K 13/04* (2006.01)
  *B23K 3/06* (2006.01)

(52) U.S. Cl.
  CPC .............. *B41F 15/26* (2013.01); *B41F 15/46* (2013.01); *B41F 35/005* (2013.01); *H05K 13/0465* (2013.01); *B23K 3/0638* (2013.01); *B41P 2215/114* (2013.01); *B41P 2235/242* (2013.01); *B41P 2235/244* (2013.01); *B41P 2235/246* (2013.01)

(56) References Cited

U.S. PATENT DOCUMENTS

| | | | |
|---|---|---|---|
| 2013/0192481 A1* | 8/2013 | Abe | B41F 33/0081 101/123 |
| 2014/0001241 A1* | 1/2014 | Igarashi | B23K 3/08 228/9 |
| 2014/0102322 A1 | 4/2014 | Tomomatsu et al. | |
| 2014/0366756 A1* | 12/2014 | Gray | B41F 15/06 101/129 |
| 2015/0129641 A1* | 5/2015 | Kuroda | B23K 3/0638 228/41 |

FOREIGN PATENT DOCUMENTS

| | | |
|---|---|---|
| JP | H08-082920 A | 3/1996 |
| JP | 2001-038876 A * | 2/2001 |
| JP | 2009-044078 A | 2/2009 |
| JP | 2013-043418 A | 3/2013 |

OTHER PUBLICATIONS

Chinese Office Action issued in Chinese Patent Application No. 201410497539.2 dated Aug. 31, 2017.

* cited by examiner

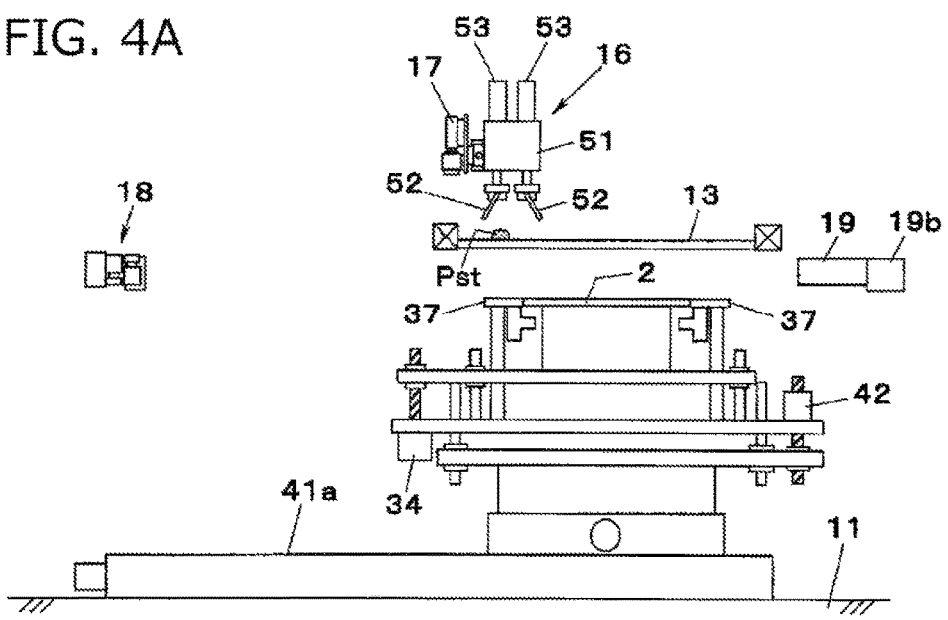
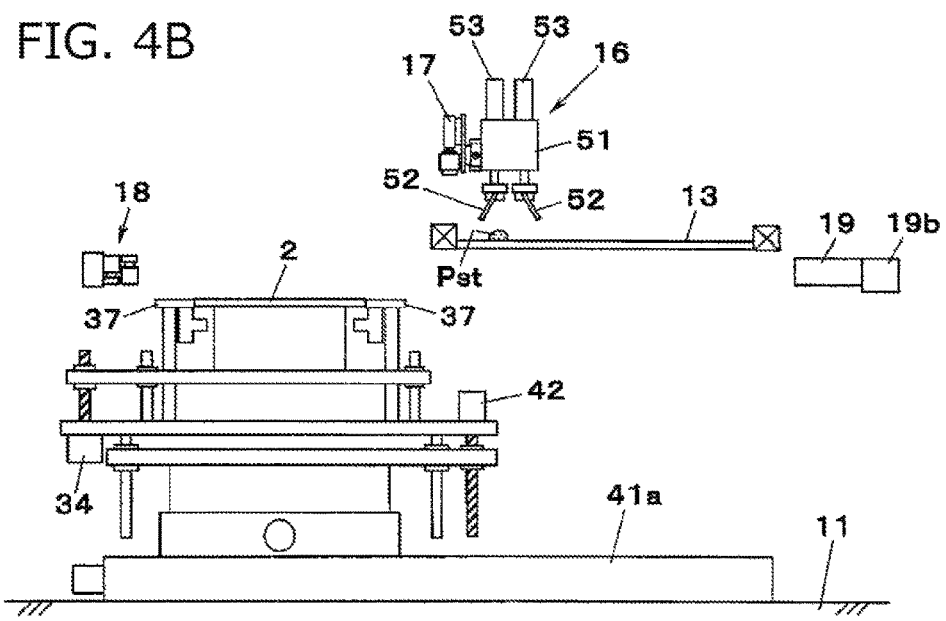

SCREEN PRINTER, COMPONENT MOUNTING LINE, AND SCREEN PRINTING METHOD

CROSS REFERENCE TO RELATED APPLICATION(S)

The present disclosure relates to the subject matters contained in Japanese Patent Application No. 2013-206076 filed on Oct. 1, 2013, which are incorporated herein by reference in its entirety.

FIELD

One or more embodiments of the present invention relate to a screen printer which prints a paste on a substrate via a mask, a component mounting line which is configured to include the screen printer, and a screen printing method.

BACKGROUND

Screen printers are configured to print a paste on a substrate by bringing the substrate held by a substrate holder into contact with a mask from underneath the mask and by then moving a printing head such as a squeegee on the mask. Here, contact between the substrate and the mask is performed based on an imaging result (information about the position of the substrate) obtained by imaging the substrate using an imaging device such as a camera. In addition, in order to improve printing accuracy, mask cleaning is also performed to remove the paste adhering to the mask by sliding a mask cleaner on a lower surface of the mask separated from the substrate.

In the screen printers, the imaging of the substrate by the imaging device and the mask cleaning by the mask cleaner are performed as described above. However, since both the imaging device and the mask cleaner are disposed in a region between the substrate holder and the mask, it is difficult to perform the imaging and the cleaning in parallel and it is necessary to perform the imaging and the cleaning serially at different times (see Patent Document 1, for instance).

Patent Document 1 is JP-A-2013-43418.

SUMMARY

However, when the imaging of the substrate and the cleaning of the mask are performed at different times as described above, one operation waits for the end of the other operation, and thus there is a concern that time loss may be caused corresponding to the wait and takt time may thus be deteriorated. Particularly, in fine pitch printing requiring high printing accuracy, since it is necessary to clean the mask every time screen printing is performed on each substrate, the time loss has a significantly large effect.

An object of one or more embodiments of the invention is to provide a screen printer, a component mounting line, and a screen printing method capable of performing the imaging of a substrate and the cleaning of a mask in parallel and of preventing deterioration in takt time.

(1) A screen printer includes: a substrate holder that holds a substrate; a mask to be contacted with the substrate; an imaging device that images the substrate held by the substrate holder; an elevation mechanism that moves up the substrate holder at a below-mask-position below the mask based on a result of the imaging of the substrate by the imaging device to contact the substrate held by the substrate holder with the mask; a horizontal moving mechanism that moves the substrate holder between the below-mask-position and a retreat position retreated in a horizontal direction from the below-mask-position; a printing head that moves on the mask being contacted with the substrate and prints a paste on the substrate via the mask; and a mask cleaner that cleans a lower surface of the mask with the substrate being separated from the mask by the elevation mechanism, wherein the imaging of the substrate by the imaging device and the cleaning of the mask by the mask cleaner are performed with the substrate holder being positioned at the retreat position by the horizontal moving mechanism.

(2) In the screen printer according to (1), the imaging of the substrate by the imaging device and the cleaning of the mask by the mask cleaner are performed in parallel.

(3) A component mounting line includes: the screen printer according to (1) or (2); and a component mounting machine that mounts a component on the substrate on which the paste is printed by the screen printer.

(4) A screen printing method includes: holding a substrate by a substrate holder; imaging the substrate held by the substrate holder by an imaging device; contacting the substrate held by the substrate holder with a mask by moving the substrate holder up at a below-mask-position below the mask based on a result of the imaging of the substrate; moving a printing head on the mask to print a paste on the substrate via the mask; and cleaning a lower surface of the mask by a mask cleaner with the substrate being separated from the mask, wherein the imaging of the substrate and the cleaning of the mask are performed with the substrate holder being positioned at a retreat position retreated in a horizontal direction from the below-mask-position.

(5) In the screen printing method according to (4), the imaging of the substrate and the cleaning of the mask are performed in parallel.

In the embodiments, the substrate holder holding a substrate is movable between a below-mask-position below the mask and a retreat position retreated in a horizontal direction from the below-mask-position, and both of the imaging of the substrate by the imaging device and the cleaning of the mask by the mask cleaner are performed with the substrate holder being positioned at the retreat position. Accordingly, the moving range of the imaging device when performing the imaging of the substrate and the moving range of the mask cleaner when cleaning the mask do not mutually overlap, and thus the imaging of the substrate by the imaging device and the cleaning of the mask by the mask cleaner can be performed in parallel. Therefore, it is possible to prevent deterioration in takt time without causing a situation where one operation waits for the end of the other operation.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

FIGS. 4A and 4B are side views of the screen printer of the embodiment of the invention.

DETAILED DESCRIPTION OF THE EMBODIMENTS

Figure 1:
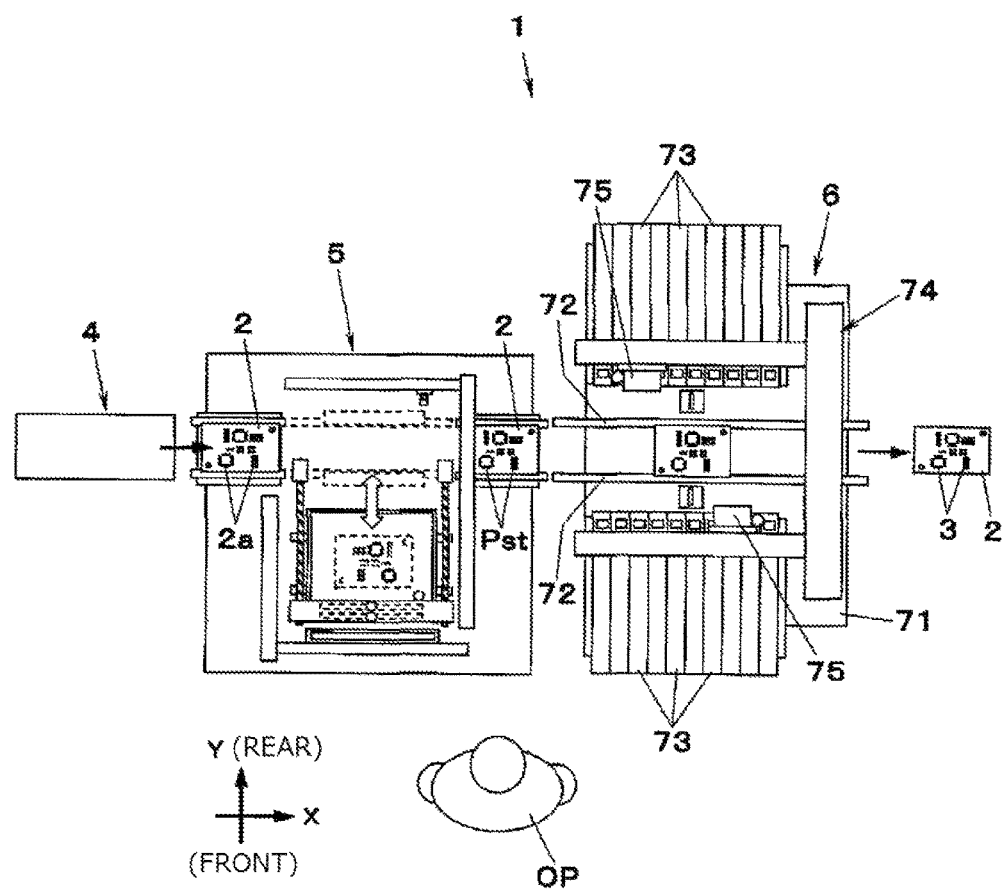
FIG. 1 is a schematic diagram of a configuration of a component mounting line of an embodiment of the invention.

Hereinafter, an exemplary embodiment of the invention will be described with reference to the drawings. FIG. 1 shows a component mounting line 1 of an embodiment of the invention. The component mounting line 1 is provided to manufacture a component mounting substrate by mounting a component 3 on a substrate 2, and is configured to include a screen printer 5 which performs screen printing with a paste Pst such as solder on electrodes 2a on the substrate 2 supplied from a substrate supply portion 4, and a component mounting machine 6 which mounts the component 3 on the substrate 2 on which the paste Pst is printed by the screen printer 5. In this embodiment, a direction in which the substrate 2 flows in the component mounting line 1 is a horizontal in-plane direction from the left side toward the right side (a lateral direction viewed from an operator OP) in FIG. 1, and is called an X-axis direction. A horizontal in-plane direction (a front-back direction viewed from the operator OP) perpendicular to the X-axis direction is called a Y-axis direction, and a vertical direction is called a Z-axis direction. In this embodiment, the left side of the plane of FIG. 1 corresponds to the upstream side of the flow of the substrate 2 (upstream process side), and the right side of the plane of FIG. 1 corresponds to the downstream side of the flow of the substrate 2 (downstream process side).

Figure 2:
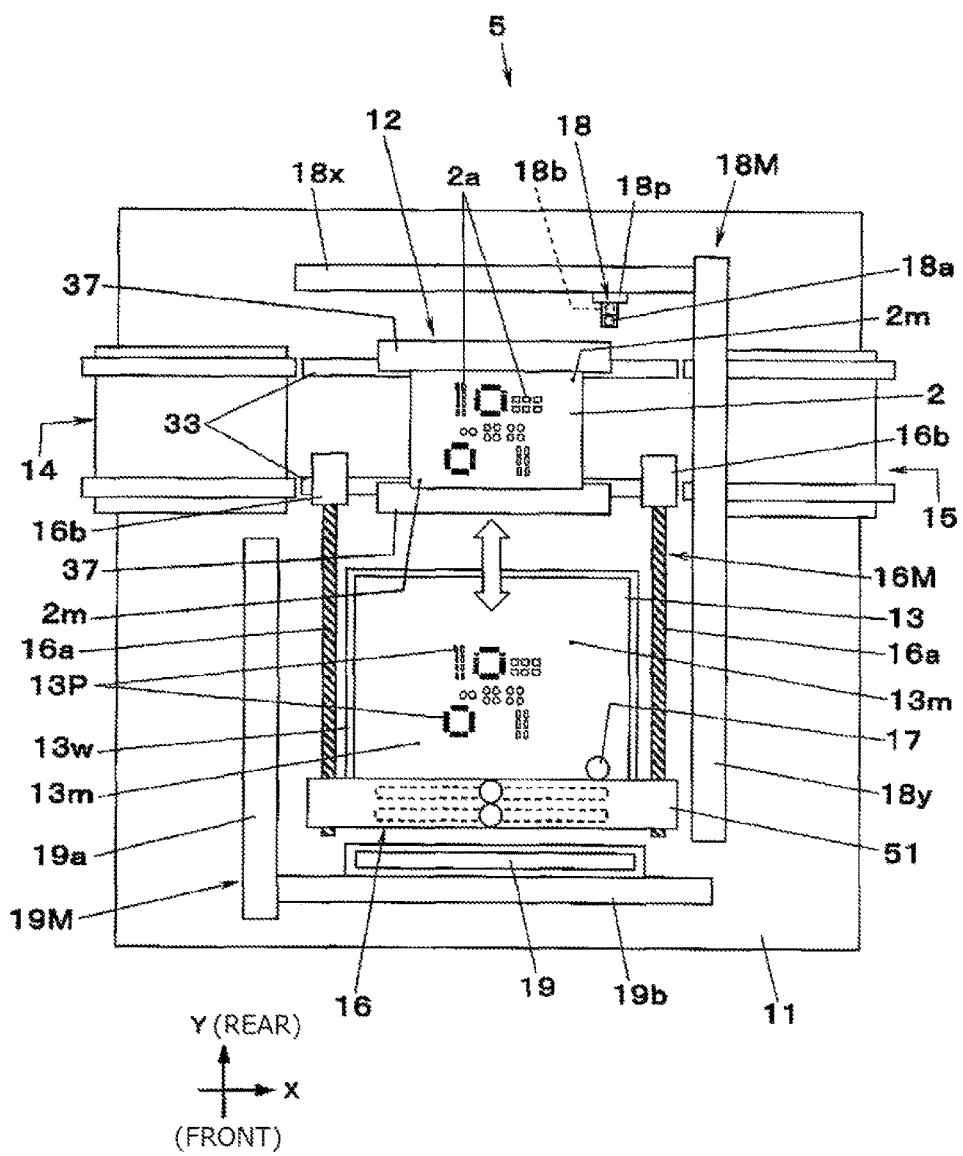
FIG. 2 is a plan view of a screen printer constituting the component mounting line of the embodiment of the invention.
Figure 3:
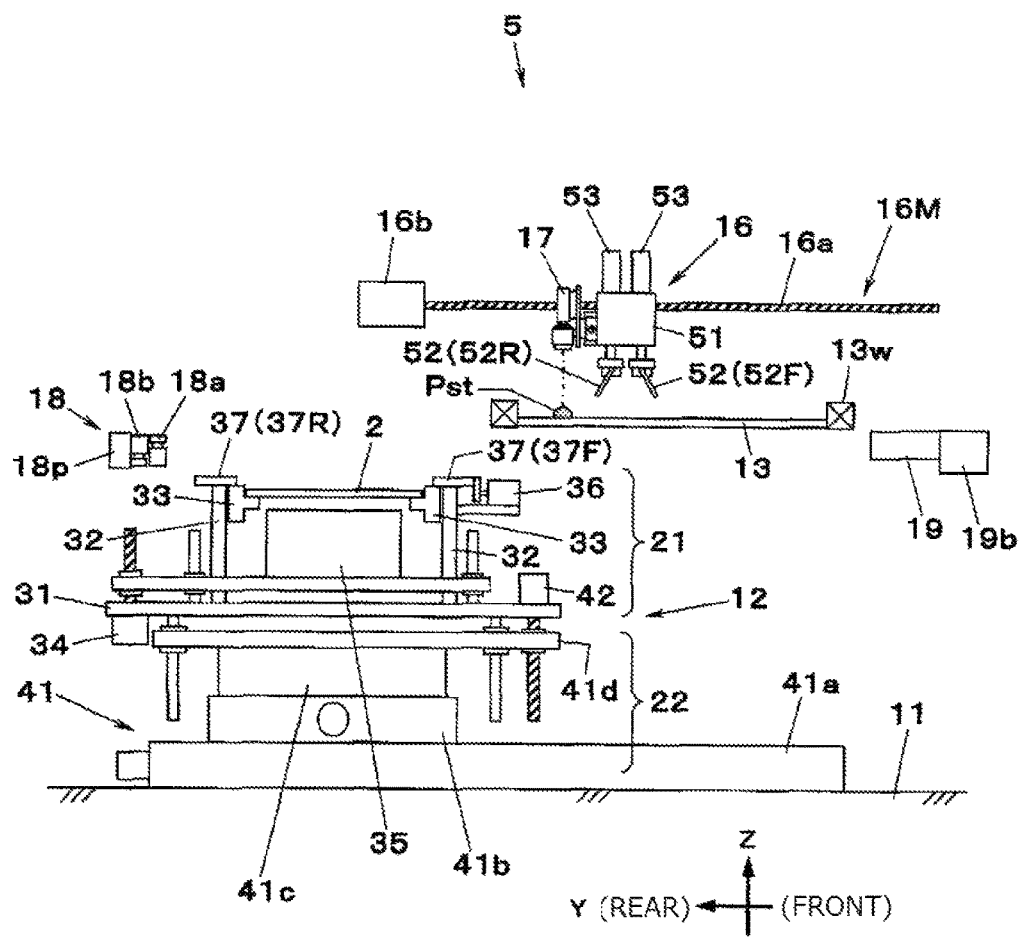
FIG. 3 is a side view of the screen printer of the embodiment of the invention.

In FIGS. 2 and 3, the screen printer 5 is provided with a substrate holding and moving mechanism 12 on a base 11, and a mask 13 on which patterns 13P to be printed on the substrate 2 are formed is installed above the substrate holding and moving mechanism 12. On the upstream side of the flow of the substrate 2 of the substrate holding and moving mechanism 12 on the base 11 (on the left side of the plane of FIG. 1), a feeding conveyor 14 as a substrate feeding portion which transfers the substrate 2 fed from another device (here, the substrate supply portion 4) on the upstream process side to the substrate holding and moving mechanism 12, and a discharge conveyor 15 as a substrate discharge portion which receives the substrate 2 sent from the substrate holding and moving mechanism 12 and discharges the substrate 2 to another device (here, the component mounting machine 6) on the downstream process side are provided. In addition, the screen printer 5 is provided with, above the mask 13, a printing head 16 which is moved by a printing head moving mechanism 16M and a paste supply syringe 17 which is provided integrally with the printing head 16, and is provided with, below the mask 13, a camera unit 18 as imaging device which is moved in the horizontal plane by a camera unit moving mechanism 18M and a mask cleaner 19 which is moved in the Y-axis direction by a cleaner moving mechanism 19M.

In FIG. 3, the substrate holding and moving mechanism 12 of the screen printer 5 is formed of a substrate holder 21 which holds the substrate 2 and a substrate holder moving mechanism 22 which moves the substrate holder 21. The substrate holder 21 is provided with an elevation plate 31 which becomes a base, a pair of conveyors 33 (also see FIG. 2), each of which is attached to a conveyor support member 32 extending upward from the elevation plate 31, a lower receiving member 35 which is moved up and down above the elevation plate 31 by a first elevation motor 34 attached to the elevation plate 31, and a pair of clampers 37 (also see FIG. 2) which are provided above the conveyors 33 and are opened or closed by a clamper drive motor 36 in the Y-axis direction. The conveyors 33 transport the substrate 2 received from the feeding conveyor 14 in the X-axis direction and position the substrate 2 at a predetermined clamping position, and the lower receiving member 35 supports the substrate 2 positioned at the clamping position from underneath. The clampers 37 clamp, in the Y-axis direction, side faces (side faces opposed to each other in the Y-axis direction) of the substrate 2 supported by the lower receiving member 35. Among the two clampers 37 provided in parallel in the Y-axis direction, one positioned on the side of the operator OP (on the right side of the plane of FIG. 3, regarded as the front side) is referred to as a front clamper 37F, and the other positioned on the opposite side to the operator OP (on the left side of the plane of FIG. 3, regarded as the rear side) is referred to as a rear clamper 37R.

In FIG. 3, the substrate holder moving mechanism 22 has an XYθ-table mechanism 41 which moves a base table 41d in the horizontal plane with mutual relative movement of a Y-table 41a, an X-table 41b, and a θ-table 41c configured in steps on the base 11, and a second elevation motor 42 which moves the elevation plate 31 (that is, the entire substrate holder 21) up and down with respect to the base table 41d. The substrate holder moving mechanism 22 moves the substrate holder 21 holding (clamping by the clampers 37) the substrate 2 by the XYθ-table mechanism 41 in the horizontal plane, and moves the substrate holder 21 up and down by the second elevation motor 42.

The base table 41d, that is, the substrate holder 21 is movable by the XYθ-table mechanism 41 between a below-mask-position (FIG. 4A) below the mask 13 and a retreat position (FIG. 4B) retreated in a horizontal direction (here, in a direction away from the operator OP) from the below-mask-position. That is, in this embodiment, the XYθ-table mechanism 41 is a horizontal moving mechanism which moves the substrate holder 21 between the below-mask-position below the mask 13 and the retreat position retreated in the horizontal direction from the below-mask-position. As shown in FIG. 2, each of the feeding conveyor 14 and the discharge conveyor 15 is provided at a position opposed to a conveyor 33 of the substrate holder 21 in the X-axis direction with the substrate holder 21 being positioned at the retreat position. The substrate holder 21 receives and holds the substrate 2 from the feeding conveyor 14 in a state of being positioned at the retreat position. In addition, the substrate holder 21 transfers the substrate 2 to the discharge conveyor 15 in a state of being positioned at the retreat position.

In FIG. 2, the mask 13 has a rectangular flat plate shape extending in the X-Y plane, and an outer circumference thereof is supported by a frame member 13w. The mask 13 has the patterns 13P formed in an arrangement corresponding to the arrangement of the electrodes 2a of the substrate 2.

In FIG. 2, a pair of substrate-side marks 2m are provided at a diagonal position of the substrate 2, and a pair of mask-side marks 13m are provided corresponding to the substrate-side marks 2m on the mask 13. In a state in which the substrate holder 21 holding the substrate 2 at the retreat position is moved to the below-mask-position by the XYθ-table mechanism 41 to match the two substrate-side marks 2m and the two mask-side marks 13m when viewed from above, when the second elevation motor 42 moves up the substrate holder 21 to contact the substrate 2 held by the substrate holder 21 with the mask 13, the electrodes 2a of the substrate 2 and the patterns 13P of the mask 13 are matched. In this embodiment, the second elevation motor 42 is an elevation mechanism which moves up the substrate holder 21 holding the substrate 2 at the below-mask-position below the mask 13 to contact the substrate 2 with the mask 13.

In FIGS. 2 and 3, the printing head 16 is provided with two squeegees 52 opposed to each other in the Y-axis direction below a moving base 51 provided to extend in the X-axis direction. The printing head moving mechanism 16M has two printing head moving ball screws 16a which extend in the Y-axis direction and are screwed into right and left end portions of the moving base 51, and two printing head moving motors 16b which rotate and drive the two printing head moving ball screws 16a. When the two printing head moving ball screws 16a are rotated in synchronization with each other by the two printing head moving motors 16b, the moving base 51 is moved in the Y-axis direction. Each of the two squeegees 52 is separately moved up and down below the moving base 51 by a squeegee elevation cylinder 53 provided in the moving base 51. Among the two squeegees 52 provided in parallel in the Y-axis direction, one positioned on the side of the operator OP (on the right side of the plane of FIG. 3) is referred to as a front squeegee 52F, and the other positioned on the opposite side to the operator OP (on the left side of the plane of FIG. 3) is referred to as a rear squeegee 52R.

In FIGS. 2 and 3, the camera unit 18 has an upper imaging camera 18a of which an imaging visual field is directed upward and a lower imaging camera 18b of which an imaging visual field is directed downward. The camera unit moving mechanism 18M which moves the camera unit 18 in the horizontal in-plane direction is provided with a Y-axis table 18y which is provided to extend in the Y-axis direction on the base 11, an X-axis table 18x which extends in the X-axis direction and is moved on the Y-axis table 18y, and a moving plate 18p which is moved on the X-axis table 18x. The camera unit 18 which is attached to the moving plate 18p is moved in the horizontal plane with the movement of the X-axis table 18x with respect to the Y-axis table 18y in the Y-axis direction and the movement of the moving plate 18p with respect to the X-axis table 18x in the X-axis direction. With the substrate holder 21 being positioned at the retreat position by the XYθ-table mechanism 41, the camera unit 18 performs imaging of the mask-side marks 13m and imaging of the substrate-side marks 2m of the substrate 2 held by the substrate holder 21. The upper imaging camera 18a performs the imaging of the mask-side marks 13m and the lower imaging camera 18b performs the imaging of the substrate-side marks 2m.

The paste supply syringe 17 stores a paste Pst therein, and emits and supplies the paste to the lower side. In FIGS. 2 and 3, the paste supply syringe 17 which is attached to the moving base 51 can be moved together with the squeegees 52 in the Y-axis direction with the movement of the moving base 51 in the Y-axis direction, and can be moved in the X-axis direction on the moving base 51. Therefore, the paste supply syringe 17 is freely moved in the horizontal plane with the movement of the moving base 51 in the Y-axis direction and the movement of the paste supply syringe 17 in the X-axis direction, and thus can supply the paste Pst to an arbitrary region on the mask 13.

Figure 5:
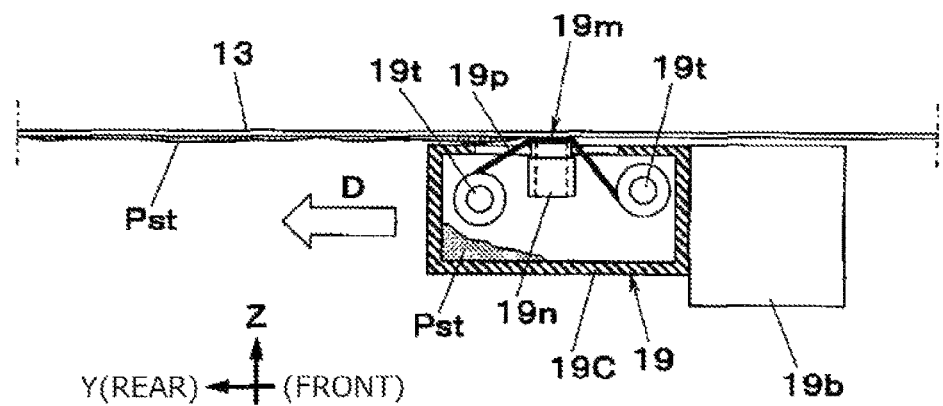
FIG. 5 is a sectional side view of a mask cleaner of the screen printer of the embodiment of the invention.

In FIG. 2, the cleaner moving mechanism 19M is provided with a Y-axis table 19a which is provided to extend in the Y-axis direction above the base 11 and an X-axis table 19b which extends in the X-axis direction and is moved on the Y-axis table 19a, and the mask cleaner 19 is attached to the X-axis table 19b. In FIG. 5, the mask cleaner 19 is configured so that a paper member 19p supplied (updated) with a rotation operation of two rotors 19t provided in a housing 19C is pushed to the upper side of the housing 19C by a nozzle 19n which is movable in the vertical direction, to form a paste wiping surface 19m. The mask cleaner 19 is moved in the Y-axis direction with the movement of the X-axis table 18x with respect to the Y-axis table 18y in the Y-axis direction, and performs a suction operation by the nozzle 19n while sliding the paste wiping surface 19m of the paper member 19p on a lower surface of the mask 13. The mask cleaner 19 cleans the lower surface of the mask 13 with the substrate 2 being separated from the mask 13 by the substrate holder moving mechanism 22 (specifically, the second elevation motor 42 which is an elevation mechanism thereof), and the cleaning of the mask 13 by the mask cleaner 19 is performed with the substrate holder 21 being positioned at the retreat position by the XYθ-table mechanism 41.

Figure 6:
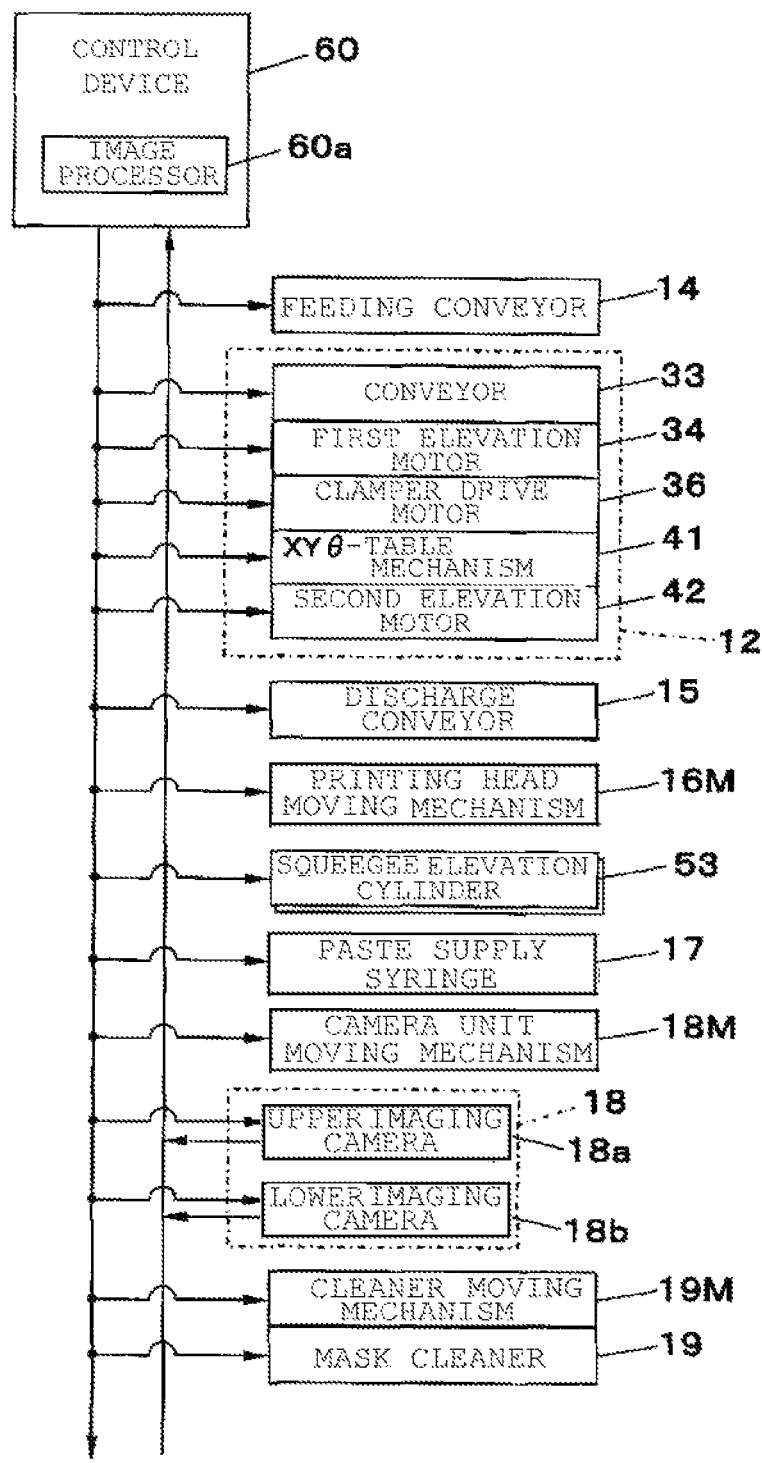
FIG. 6 is a block diagram showing a control system of the screen printer of the embodiment of the invention.
Figure 7A:
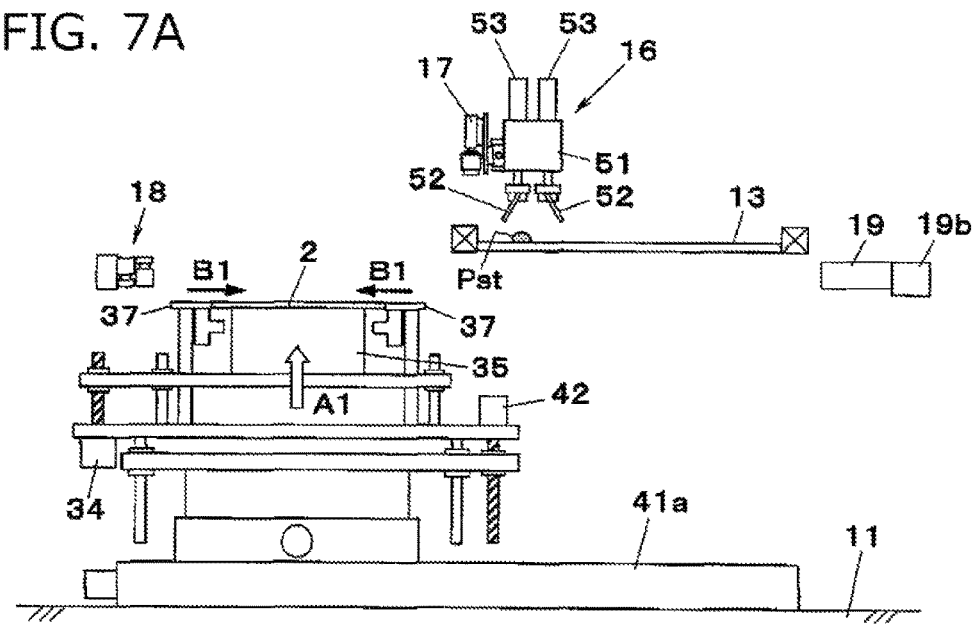
FIGS. 7A and 7B are diagrams illustrating operations of the screen printer of the embodiment of the invention.
Figure 7B:
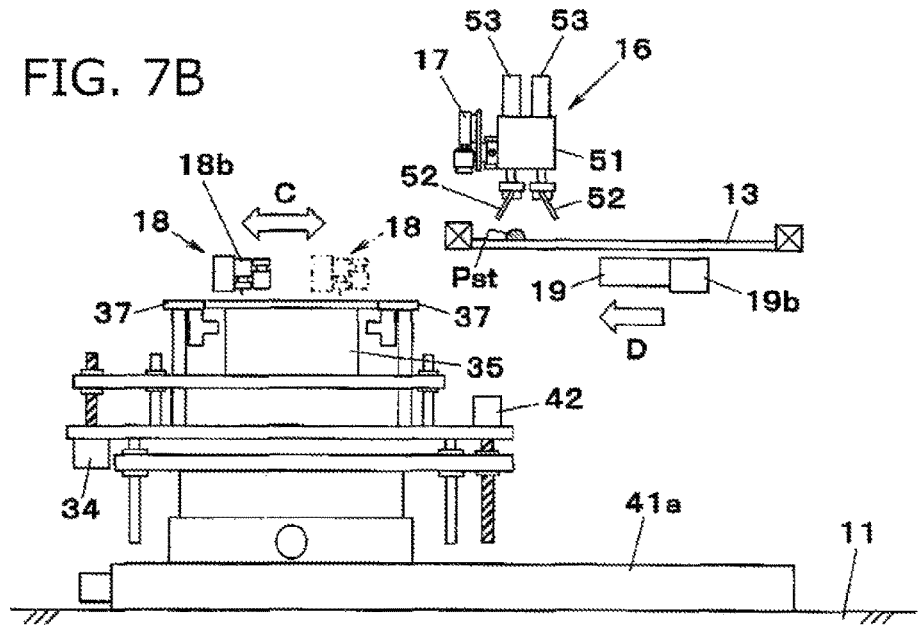

In FIG. 6, a control device 60 of the screen printer 5 controls the operation of feeding the substrate 2 by the feeding conveyor 14, the operation of moving the substrate 2 to the clamping position by the conveyor 33, the operation of moving the lower receiving member 35 up and down by the first elevation motor 34, the clamping operation of the clampers 37 by the clamper drive motor 36, the operation of moving the substrate holder 21 in the horizontal plane by the XYθ-table mechanism 41, the operation of moving the substrate holder 21 up and down by the second elevation motor 42, and the operation of discharging the substrate 2 by the discharge conveyor 15. The control device 60 also controls the operation of moving the printing head 16 in the Y-axis direction by the printing head moving mechanism 16M, the operation of moving each squeegee 52 up and down by the squeegee elevation cylinder 53, the operation of discharging the paste Pst by the paste supply syringe 17, the operation of moving the camera unit 18 in the horizontal plane by the camera unit moving mechanism 18M, the operation of moving the mask cleaner 19 in the Y-axis direction by the cleaner moving mechanism 19M, and the vertical movement of the nozzle 19n and the operation of supplying (updating) the paper member 19p in the mask cleaner 19.

In FIG. 6, the upper imaging camera 18a images the mask-side marks 13m provided in the mask 13 under the control of the control device 60. The lower imaging camera 18b images the substrate-side marks 2m of the substrate 2 held by the substrate holder 21 under the control of the control device 60. Both of image data obtained through the imaging of the upper imaging camera 18a and image data obtained through the imaging of the lower imaging camera 18b are input to the control device 60 and subjected to an image process in an image processor 60a of the control device 60. The control device 60 calculates the position of each mask-side mark 13m and the position of each substrate-side mark 2m based on the obtained images of the mask-side mark 13m and the substrate-side mark 2m (imaging result).

Next, procedures for execution of screen printing by the screen printer 5 (screen printing method) will be described with reference to FIGS. 7 to 10. When the substrate 2 is sent from the substrate supply portion 4, the control device 60 receives the substrate 2 by the feeding conveyor 14. In this case, when the substrate holder 21 is not positioned at the retreat position, the control device 60 operates the XYθ-table mechanism 41 to position the substrate holder 21 at the retreat position.

After receiving the substrate 2 by the feeding conveyor 14, the control device 60 operates the feeding conveyor 14 and the conveyor 33 of the substrate holder 21 in conjunction with each other to feed the substrate 2 to the substrate holder 21, and positions the substrate 2 at the clamping position. When the lower receiving member 35 is moved up by operating the first elevation motor 34 to support the substrate 2 from underneath and to lift the substrate 2 from the conveyor 33 (the arrow A1 shown in FIG. 7A), the clamper drive motor 36 is operated to clamp and hold the substrate 2 by the clampers 37 (the arrow B1 shown in FIG. 7A; substrate holding process).

After holding the substrate 2 by the substrate holder 21, the control device 60 moves the camera unit 18 by the camera unit moving mechanism 18M to image the mask-side marks 13m of the substrate 2 by the upper imaging camera 18a. After imaging the mask-side marks 13m, the control device 60 images the substrate-side marks 2m by the lower imaging camera 18b (the arrow C shown in FIG. 7B; imaging process), and cleans the lower surface of the mask 13 by the mask cleaner 19 in parallel with an operation of imaging the substrate-side marks 2m by the camera unit 18 (the arrow D shown in FIGS. 7B and 5; mask cleaning process).

As described above, in the screen printing method of this embodiment, both the imaging process and the mask cleaning process are performed with the substrate holder 21 being positioned at the retreat position, and thus the moving range of the camera unit 18 when performing the imaging of the substrate 2 and the moving range of the mask cleaner 19 when cleaning the mask 13 do not mutually overlap. Accordingly, the imaging of the substrate 2 by the camera unit 18 and the cleaning of the mask 13 by the mask cleaner 19 can be performed in parallel.

Figure 8A:
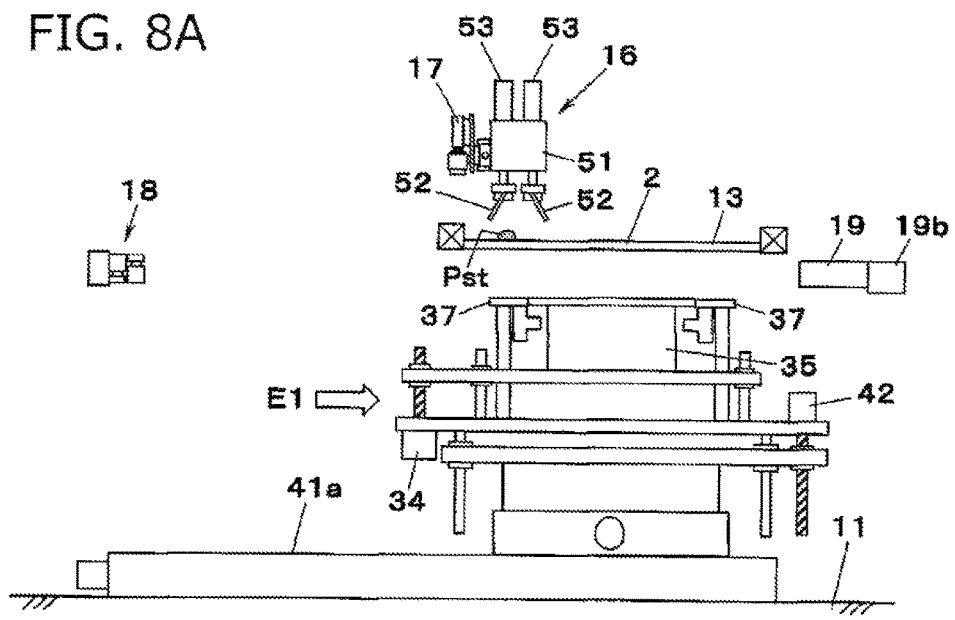
FIGS. 8A and 8B are diagrams illustrating operations of the screen printer of the embodiment of the invention.
Figure 8B:
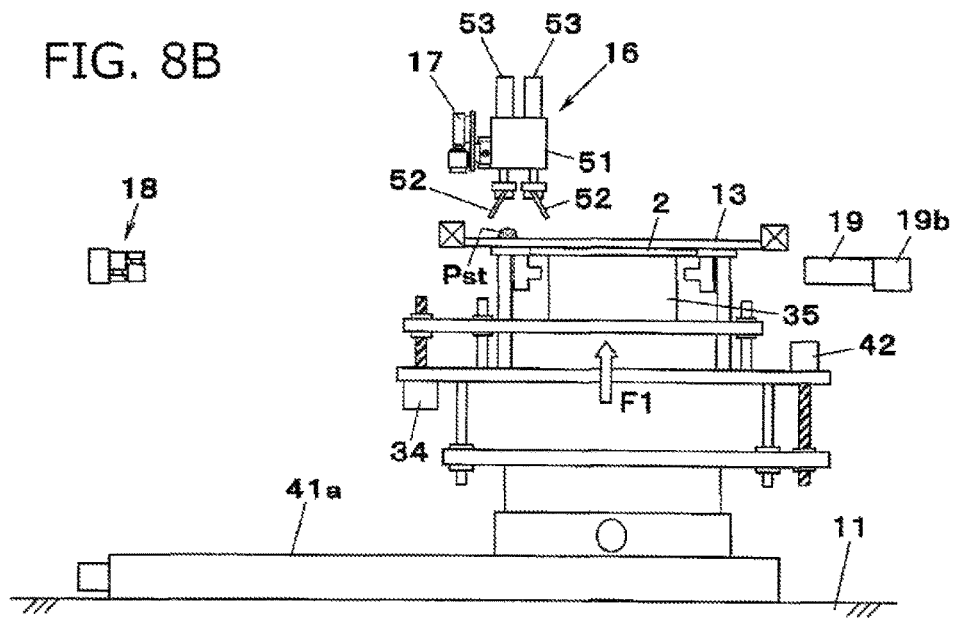

After imaging the mask-side marks 13m and the substrate-side marks 2m, the control device 60 operates the XYθ-table mechanism 41 to position the substrate holder 21 holding the substrate 2 at the below-mask-position (the arrow E1 shown in FIG. 8A). Based on a result of the imaging of the substrate-side marks 2m and the mask-side marks 13m of the substrate 2 obtained in the imaging process (position information of the substrate-side marks 2m and the mask-side marks 13m), the mask-side marks 13m and the substrate-side marks 2m are matched in the vertical direction, and the second elevation motor 42 moves the substrate holder 21 up to contact the substrate 2 held by the substrate holder 21 with the mask 13 (the arrow F1 shown in FIG. 8B); contact process). Accordingly, the electrodes 2a of the substrate 2 and the patterns 13P formed on the mask 13 are matched (FIG. 8B).

After contacting the substrate 2 with the mask 13, the control device 60 performs an examination to confirm whether a sufficient amount of the paste Pst is present on the mask 13 by a paste amount confirming device (not shown). When it is determined that there is not a sufficient amount of the paste Pst, the paste supply syringe 17 supplies the paste Pst to the mask 13.

After the contact process, when determining that there is a sufficient amount of the paste Pst on the mask 13 as a result of the confirmation of the paste amount (when the paste supply syringe 17 supplies the paste Pst, the confirmation of the paste amount is performed thereafter), the control device 60 performs squeegeeing of the paste Pst by the squeegee 52. In the squeegeeing, the control device 60 moves the moving base 51 (that is, printing head 16) in the Y-axis direction to move (slide) the squeegee 52 on the mask 13. Through the squeegeeing, the paste Pst is scraped on the mask 13 and fills the patterns 13p of the mask 13, and thus the paste Pst is printed on the substrate 2 (printing process).

Figure 9A:
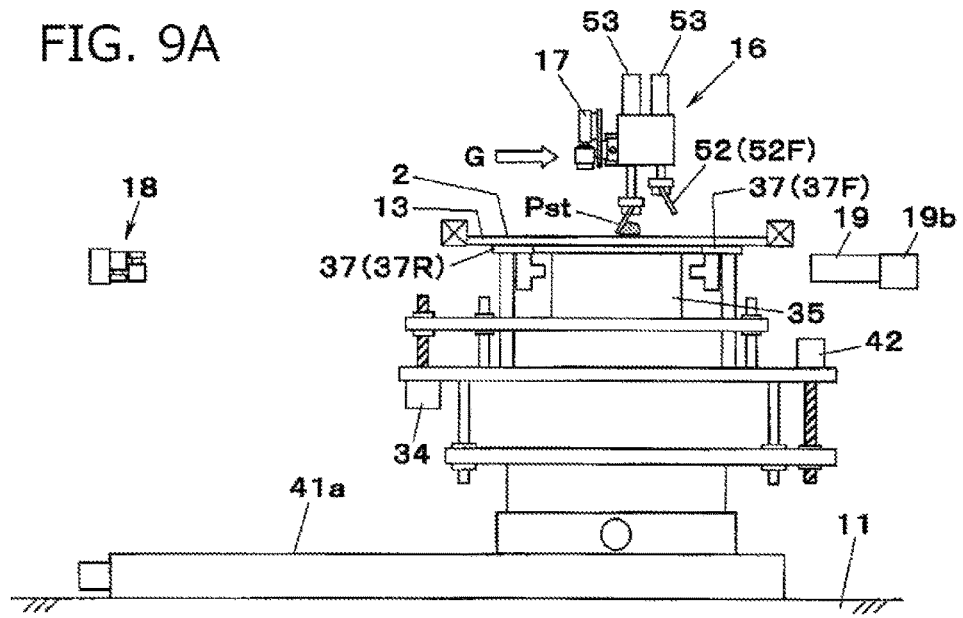
FIGS. 9A and 9B are diagrams illustrating operations of the screen printer of the embodiment of the invention.

When the above-described squeegeeing is performed by the rear squeegee 52R, the rear squeegee 52R is moved down so as to be abutted with the mask 13 contacted with the rear clamper 37R to move the moving base 51 forward (FIG. 9A). When the rear squeegee 52R reaches the mask 13 contacted with the front clamper 37F, the rear squeegee 52R is moved up and enters a standby state. When the above-described squeegeeing is performed by the front squeegee 52F, the front squeegee 52F is moved down so as to be abutted with the mask 13 contacted with the front clamper 37F to move the moving base 51 rearward. When the front squeegee 52F reaches the mask 13 contacted with the rear clamper 37R, the front squeegee 52F is moved up and enters a standby state. In this manner, in the screen printer 5 of this embodiment, the printing head 16 is moved on the mask 13 with the substrate 2 being contacted with the mask 13 and prints the paste Pst on the substrate 2 via the mask 13.

Figure 9B:
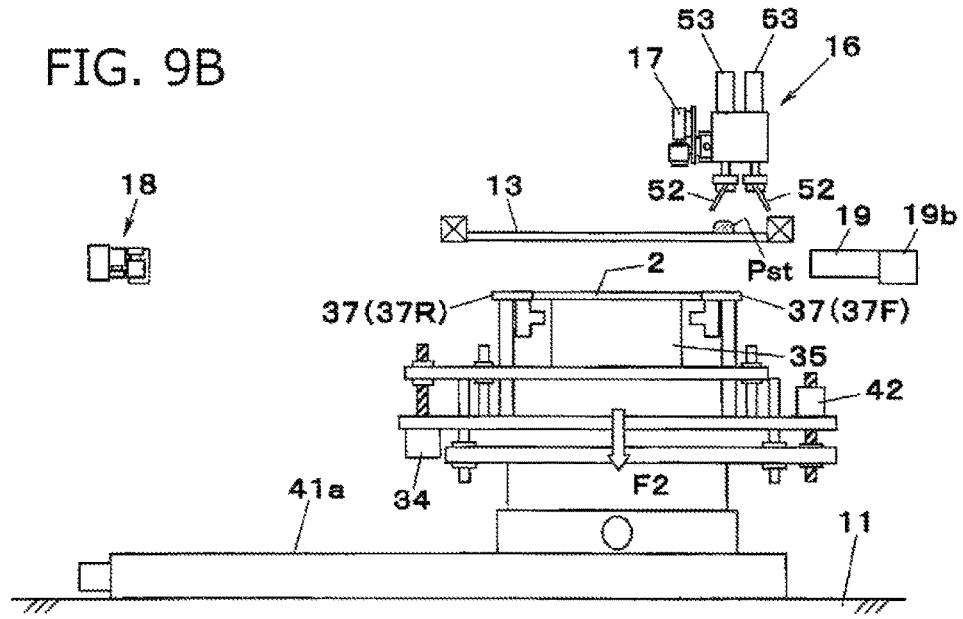

After printing the paste Pst on the substrate 2 by moving the printing head 16 and by filling the pattern 13P of the mask 13 with the paste Pst, the control device 60 operates the first elevation motor 34 to move the elevation plate 31 down (the arrow F2 shown in FIG. 9B) to thus separate the substrate 2 and the mask 13 from each other, thereby performing plate releasing (FIG. 9B). Accordingly, the screen printing per one substrate 2 ends.

Figure 10A:
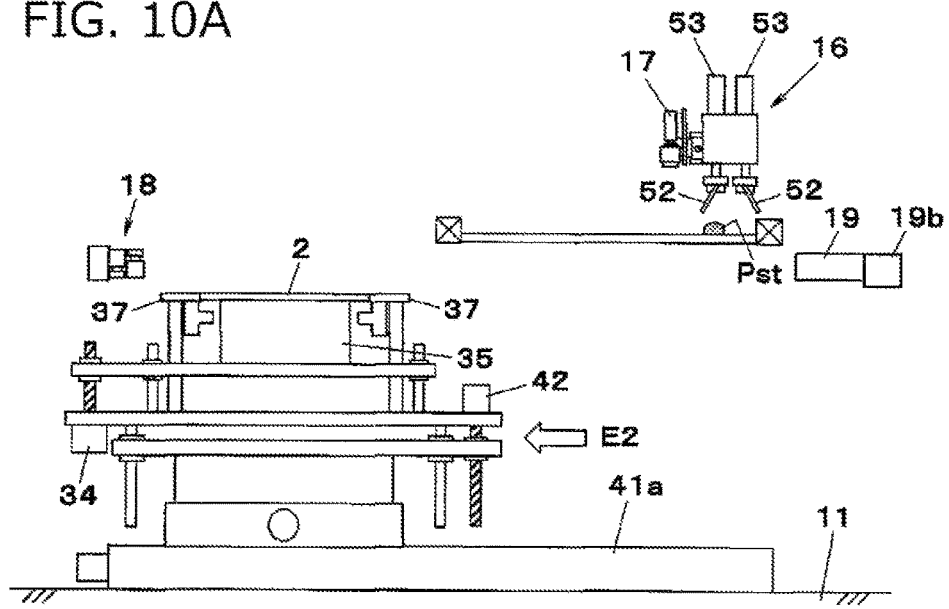
FIGS. 10A and 10B are diagrams illustrating operations of the screen printer of the embodiment of the invention.
Figure 10B:
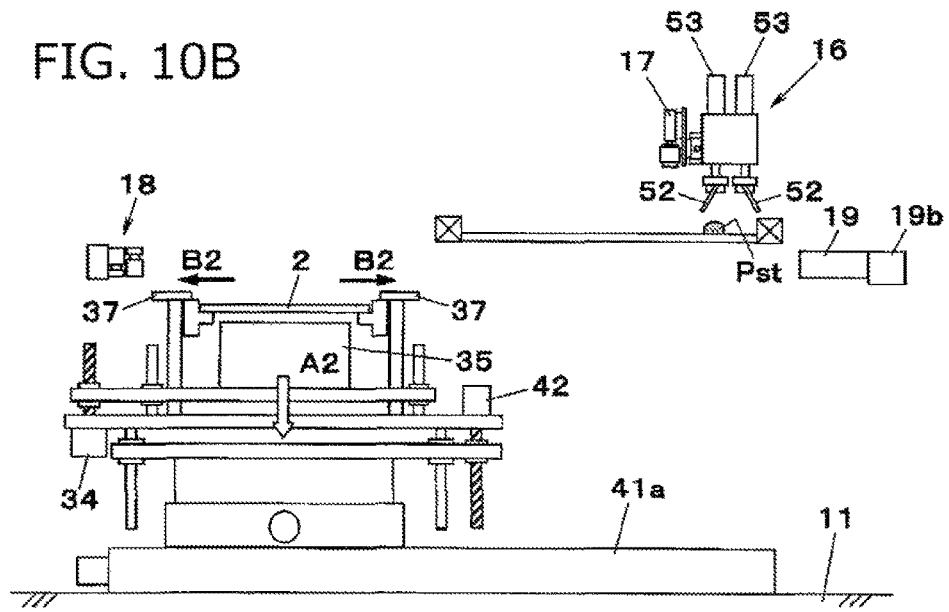

After the end of the screen printing per one substrate 2, the control device 60 moves the substrate holder 21 holding the substrate 2 to the retreat position (the arrow E2 shown in FIG. 10A). The clampers 37 are opened (the arrow B2 shown in FIG. 10B), and then the lower receiving member 35 is moved down (the arrow A2 shown in FIG. 10B) to place the substrate 2 on the conveyor 33 (FIG. 10B). When the substrate 2 is placed on the conveyor 33, the conveyor 33 and the discharge conveyor 15 are operated in conjunction with each other to discharge the substrate 2 to another device (component mounting machine 6) on the downstream process side from the screen printer 5. After discharging the substrate 2, the control device 60 determines whether there is another substrate 2 to be subjected to the screen printing. As a result, when there is another substrate 2 to be subjected to the screen printing, the substrate 2 is fed by the feeding conveyor 14, and when there is no substrate 2 to be subjected to the screen printing, a series of operations ends.

In FIG. 1, the component mounting machine 6 is provided with a substrate transport lane 72 on a base 71, a plurality of part feeders 73 as a component supply portion, and two mounting heads 75 which are moved by a head moving mechanism 74 formed of an XY-robot. The substrate transport lane 72 receives and feeds the substrate 2 on which the paste Pst is printed by the screen printer 5 from the discharge conveyor 15 of the screen printer 5, and positions the substrate 2 at a predetermined position. Each of the two mounting heads 75 picks up a component 3 supplied from each part feeder 73 and mounts the component 3 on the substrate 2 positioned by the substrate transport lane 72.

When the mounting of the component 3 on the substrate 2 ends, the substrate transport lane 72 is operated to discharge the substrate 2 to the outside (downstream process side).

The screen printing method using the screen printer 5 of this embodiment includes a substrate holding process of holding a substrate 2 by the substrate holder 21, an imaging process of imaging the substrate 2 held by the substrate holder 21 using the camera unit 18 (imaging device), a contact process of contacting the substrate 2 held by the substrate holder 21 with the mask 13 by moving up the substrate holder 21 at the below-mask-position below the mask 13 based on a result of the imaging of the substrate 2 obtained in the imaging process, a printing process of moving the printing head 16 on the mask 13 after the contact process to print a paste Pst on the substrate 2 via the mask 13, and a mask cleaning process of cleaning a lower surface of the mask 13 by the mask cleaner 19 with the substrate 2 being separated from the mask 13, and the imaging process and the mask cleaning process are performed with the substrate holder 21 being positioned at the retreat position retreated in the horizontal direction from the below-mask-position.

As described above, in the screen printer 5 (and the screen printing method using the screen printer 5) of this embodiment, the substrate holder 21 holding a substrate 2 is movable between the below-mask-position below the mask 13 and the retreat position retreated in the horizontal direction from the below-mask-position, and both the imaging of the substrate 2 by the camera unit 18 (imaging device) and the cleaning of the mask 13 by the mask cleaner 19 are performed with the substrate holder 21 being positioned at the retreat position. Accordingly, the moving range of the camera unit 18 when performing the imaging of the substrate 2 and the moving range of the mask cleaner 19 when cleaning the mask 13 do not mutually overlap, and thus the imaging of the substrate 2 by the camera unit 18 and the cleaning of the mask 13 by the mask cleaner 19 can be performed in parallel. Therefore, it is possible to prevent deterioration in takt time without causing a situation where one operation waits for the end of the other operation.

There is provided a screen printer, a component mounting line, and a screen printing method capable of performing the imaging of a substrate and the cleaning of a mask in parallel and of preventing deterioration in takt time.

What is claimed is:

1. A screen printing method comprising:
    holding a first substrate by a substrate holder placed on a base;
    moving an imaging device in a horizontal direction of a mask and the first substrate, and imaging the first substrate held by the substrate holder by the imaging device;
    contacting the first substrate held by the substrate holder with the mask before a printing by moving the substrate holder up at a below-mask-position below the mask before the printing based on a result of the imaging of the first substrate;
    moving a printing head on the mask to print a paste on the first substrate; and
    moving a mask cleaner under the mask after the printing within a moving range of the mask cleaner and cleaning a lower surface of the mask after the printing by the mask cleaner with the first substrate being separated from the mask after the printing,
    wherein an imaging of a second substrate is performed when the substrate holder is positioned at an initial position between a feeding conveyor and a discharge conveyor and in line with the conveyors away from the below-mask-position outside the moving range of the mask cleaner in the horizontal direction, while simultaneously, the cleaning of the mask after the printing is performed when the substrate holder holding the second substrate is positioned at the initial position.

2. The screen printing method according to claim 1, wherein the imaging of the second substrate and the cleaning of the mask are performed in parallel while the substrate holder is positioned at the initial position.

3. The screen printing method according to claim 1, wherein the imaging of the first substrate is performed by the imaging device positioned at a first height between a lower surface of the mask and an upper surface of the first substrate, the imaging of the second substrate is performed by the imaging device positioned at the first height between the lower surface of the mask and an upper surface of the second substrate, and the cleaning of the mask is performed by the mask cleaner positioned at a second height between the lower surface of the mask and the upper surface of the first or second substrate, and the imaging of the second substrate and the cleaning of the mask are concurrently performed.

4. The screen printing method according to claim 3, wherein viewed from a direction parallel to the lower surface of the mask, the first height and the second height are at a same height from the base.

5. The screen printing method according to claim 3, wherein the imaging of the second substrate is performed without waiting for the cleaning of the mask and the cleaning of the mask is performed without waiting for the imaging of the second substrate.

* * * * *